United States Patent
Guzek

(10) Patent No.: US 9,147,669 B2
(45) Date of Patent: Sep. 29, 2015

(54) RECESSED AND EMBEDDED DIE CORELESS PACKAGE

(71) Applicant: Intel Corporation, Santa Clara, CA (US)

(72) Inventor: John Guzek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/254,474

(22) Filed: Apr. 16, 2014

(65) Prior Publication Data

US 2014/0357024 A1    Dec. 4, 2014

Related U.S. Application Data

(62) Division of application No. 12/655,321, filed on Dec. 29, 2009, now Pat. No. 8,742,561.

(51) Int. Cl.
*H01L 23/02* (2006.01)
*H01L 23/00* (2006.01)
(Continued)

(52) U.S. Cl.
CPC ............ *H01L 24/82* (2013.01); *H01L 21/6835* (2013.01); *H01L 23/49816* (2013.01); *H01L 23/5389* (2013.01); *H01L 24/19* (2013.01); *H01L 25/105* (2013.01); *H01L 25/16* (2013.01); *H01L 24/20* (2013.01); *H01L 2221/68359* (2013.01); *H01L 2224/12105* (2013.01); *H01L 2224/19* (2013.01); *H01L 2224/2101* (2013.01); *H01L 2224/2105* (2013.01); *H01L 2224/221* (2013.01); *H01L 2224/821* (2013.01); *H01L 2224/8234* (2013.01); *H01L 2224/8236* (2013.01); *H01L 2225/1052* (2013.01); *H01L 2225/1058* (2013.01); *H01L 2924/01029* (2013.01); *H01L 2924/01033* (2013.01); *H01L 2924/01046* (2013.01);
(Continued)

(58) Field of Classification Search
USPC .................................................. 438/125, 106
See application file for complete search history.

(56) References Cited

U.S. PATENT DOCUMENTS 5,353,498 A    10/1994   Fillion et al.
5,497,033 A    3/1996    Fillion et al.
(Continued)

FOREIGN PATENT DOCUMENTS

CN    101064287 A    10/2007
CN    101609864 A    12/2009
(Continued)

OTHER PUBLICATIONS

Office Action received for Chinese Patent Application No. 201080059434.9, mailed on May 4, 2014, 33 pages of Office Action including 23 pages of English Translation.
Office Action received for Japanese Patent Application No. 2013-221115, mailed on May 7, 2014, 9 pages of Office Action Including 5 pages of English Translation.
Office Action received for Chinese Patent Application No. 201080059434.9, mailed on Nov. 17, 2014, 36 pages of office action including 23 pages of English Translation.
(Continued)

*Primary Examiner* — Timor Karimy
(74) *Attorney, Agent, or Firm* — Winkle, PLLC

(57) ABSTRACT

Methods of forming a microelectronic packaging structure and associated structures formed thereby are described. Those methods may include forming a cavity in a plating material to hold a die, attaching the die in the cavity, forming a dielectric material adjacent the die, forming vias in the dielectric material adjacent the die, forming PoP lands in the vias, forming interconnects in the vias, and then removing the plating material to expose the PoP lands and die, wherein the die is disposed above the PoP lands.

15 Claims, 7 Drawing Sheets

(51) Int. Cl.
*H01L 21/683* (2006.01)
*H01L 23/498* (2006.01)
*H01L 23/538* (2006.01)
*H01L 25/10* (2006.01)
*H01L 25/16* (2006.01)

(52) U.S. Cl.
CPC ............... *H01L 2924/01057* (2013.01); *H01L 2924/01078* (2013.01); *H01L 2924/01079* (2013.01); *H01L 2924/1815* (2013.01); *H01L 2924/18162* (2013.01); *H01L 2924/3511* (2013.01)

(56) References Cited

U.S. PATENT DOCUMENTS

| | | |
|---|---|---|
| 5,527,741 A | 6/1996 | Cole et al. |
| 5,841,193 A | 11/1998 | Eichelberger |
| 6,154,366 A | 11/2000 | Ma et al. |
| 6,159,767 A | 12/2000 | Eichelberger |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,489,185 B1 | 12/2002 | Towle et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,605,459 B2 | 10/2009 | Mok et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,723,164 B2 | 5/2010 | Lu et al. |
| 8,264,849 B2 | 9/2012 | Guzek |
| 8,304,913 B2 | 11/2012 | Nalla et al. |
| 8,313,958 B2 | 11/2012 | Swaminathan et al. |
| 8,319,318 B2 | 11/2012 | Nalla et al. |
| 8,372,666 B2 | 2/2013 | Crawford et al. |
| 8,431,438 B2 | 4/2013 | Nalla et al. |
| 8,508,037 B2 | 8/2013 | Manusharow et al. |
| 8,535,989 B2 | 9/2013 | Sankman et al. |
| 8,618,652 B2 | 12/2013 | Nalla et al. |
| 8,742,561 B2 | 6/2014 | Guzek |
| 2005/0161833 A1 | 7/2005 | Takeuchi et al. |
| 2007/0132072 A1 | 6/2007 | Chang |
| 2007/0155057 A1 | 7/2007 | Wang |
| 2007/0289127 A1 | 12/2007 | Hurwitz et al. |
| 2008/0054448 A1 | 3/2008 | Lu et al. |
| 2008/0192776 A1 | 8/2008 | Fleming et al. |
| 2008/0315377 A1 | 12/2008 | Eichelberger et al. |
| 2008/0315391 A1 | 12/2008 | Kohl et al. |
| 2009/0007282 A1 | 1/2009 | Tomizuka et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0212416 A1 | 8/2009 | Skeete |
| 2009/0236750 A1* | 9/2009 | Chia ............................. 257/774 |
| 2009/0246909 A1* | 10/2009 | Takeuchi et al. ............... 438/106 |
| 2009/0294942 A1 | 12/2009 | Palmer et al. |
| 2010/0044855 A1 | 2/2010 | Eichelberger et al. |
| 2010/0047970 A1 | 2/2010 | Eichelberger et al. |
| 2010/0181667 A1 | 7/2010 | Iwase et al. |
| 2011/0024899 A1 | 2/2011 | Masumoto et al. |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0215464 A1 | 9/2011 | Guzek |
| 2011/0228464 A1 | 9/2011 | Guzek et al. |
| 2011/0316140 A1 | 12/2011 | Nalla et al. |
| 2012/0001339 A1 | 1/2012 | Malatkar |
| 2012/0074580 A1 | 3/2012 | Nalla et al. |
| 2012/0074581 A1 | 3/2012 | Guzek et al. |
| 2012/0112336 A1 | 5/2012 | Guzek et al. |
| 2012/0139095 A1 | 6/2012 | Manusharow et al. |
| 2012/0139116 A1 | 6/2012 | Manusharow et al. |

FOREIGN PATENT DOCUMENTS

| | | |
|---|---|---|
| JP | 2005-209689 A | 8/2005 |
| JP | 2006-032379 A | 2/2006 |
| JP | 2006-196865 A | 7/2006 |
| JP | 2009-105393 A | 5/2009 |
| WO | 2009/001564 A1 | 12/2008 |
| WO | 2011/090568 A2 | 7/2011 |
| WO | 2011/090568 A3 | 10/2011 |

OTHER PUBLICATIONS

Office Action received for German Patent Application No. 112010005038.4, mailed on Apr. 4, 2013, 82 pages of office action only.
Office Action received for Japanese Patent Application No. 2012-544605, mailed on Aug. 6, 2013, 7 pages of Office Action Including 4 pages of English Translation.
Office Action received for Korean Patent Application No. 2012-7016870, mailed on Aug. 22, 2013, 4 pages of English Translation.
Office Action received for United Kingdom Patent Application No. 1208344.0, mailed on Sep. 9, 2013, 4 pages.
Office Action received for United Kingdom Patent Application No. 1208344.0, mailed on Dec. 20, 2013, 2 pages.
Ma et al.,"Direct Build-Up Layer On An Encapsulated Die Package", U.S. Appl. No. 09/640,961, filed on Aug. 16, 2000, 70 pages.
International Preliminary Report on Patentability and Written Opinion Received for PCT Patent Application No. PCT/US2010/059197, mailed on Jul. 12, 2012, 8 pages.
International Search Report and Written Opinion Received for PCT Patent Application No. PCT/US2010/059197, Mailed on Aug. 10, 2011, 11 pages.
Office action received for the Japanese Patent Application No. 2013-221115, mailed on Sep. 2, 2014, 7 pages of Office Action including 4 pages of English Transalation.

* cited by examiner

RECESSED AND EMBEDDED DIE CORELESS PACKAGE

RELATED APPLICATIONS

The present application is a Divisional of U.S. application Ser. No. 12/655,321 filed Dec. 29, 2009, entitled "RECESSED AND EMBEDDED DIE CORELESS PACKAGE".

BACKGROUND OF THE INVENTION

As semiconductor technology advances for higher processor performance, advances in packaging architectures may include package-on-package (PoP) architecture and other such assemblies. As the design of package structures becomes more complex, there is often a resulting increase in assembly expense. Thus there is a need to significantly lower package and assembly costs for advanced package structures.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
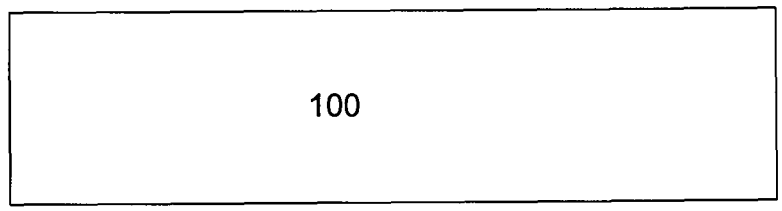
FIGS. 1a-1m represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may comprise forming a cavity in a plating material to hold a die, attaching the die in the cavity, forming a dielectric material adjacent to the die, forming vias in the dielectric material adjacent the die, forming PoP lands in the vias, forming interconnects in the vias, and then removing the plating material to expose the PoP lands and die. Methods of the present invention enable the fabrication of package-on-package architectures such as PoP assemblies comprising partially recessed and/or fully embedded die or any other type of ball grid array (BGA) package.

Figure 1B:
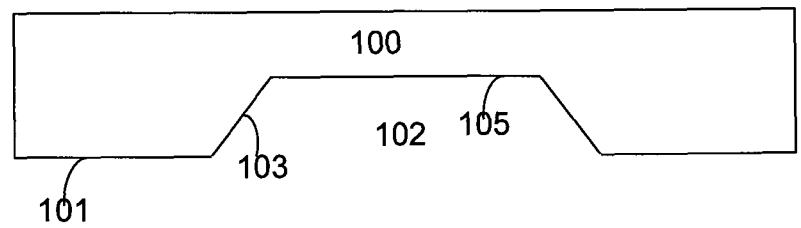

FIGS. 1a-1m illustrate embodiments of a method of forming a microelectronic structure, such as a package structure, for example. FIG. 1a illustrates a material 100. In one embodiment, the material 100 may comprise a plating material, such as but not limited to a copper foil plating material, for example. In some embodiments, any suitable plating material may be utilized, depending upon the particular application. In FIG. 1b, a cavity 102 may be formed in the material 100. The cavity 102 may be formed utilizing any suitable etching process in some embodiments, such as are known in the art. In an embodiment, the cavity 102 may be formed such that the cavity 102 may hold a die, such as a microelectronic die, for example. The cavity 102 may comprise a bottom portion 101 an angled portion 103, and a top portion 105. In an embodiment, the bottom and top portions may be separated by a barrier layer to aid in the formation of the cavity structure, especially for an etching process. In an embodiment (not shown), PoP land structures (to be described further herein) can be formed on surface 101.

Figure 1C:
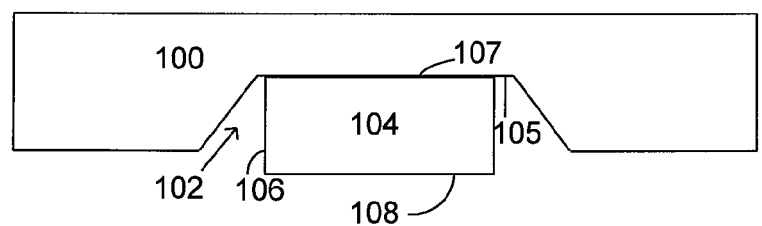

In an embodiment, a die 104 may be attached within the cavity 102 (FIG. 1c). In an embodiment, the die 104 may comprise a thin die 104, and may comprise a thickness of below about 150 microns. In an embodiment, the die 104 may be attached to the top portion 105 of the cavity 101. In an embodiment, the die 104 may comprise at least one sidewall 106, a top side 107 and a bottom/active side 108. In some cases, an adhesive film and/or an attach process may be used to attach the die 104 into the cavity 102 of the plating material 100. In an embodiment, the adhesive film (not shown), can be used as a permanent part of a final package to protect the die backside, to provide a surface for marking, and/or manage any warpage that may occur within the die 104, for example.

Figure 1D:
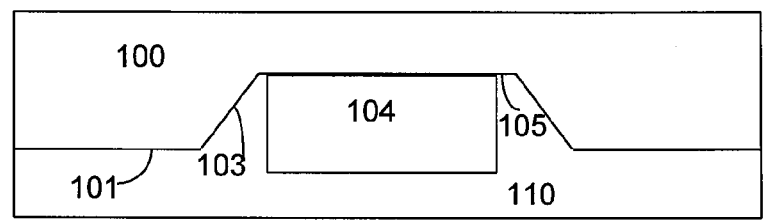
Figure 1E:
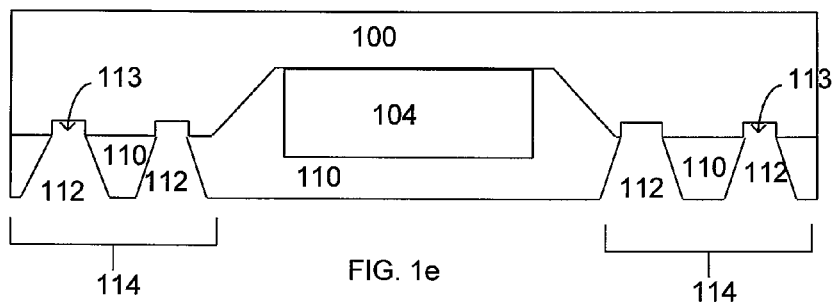

A dielectric material 110 may be formed on the plating material 100 and adjacent the die 104 that is in the cavity 102 of the plating material 100 (FIG. 1d). In an embodiment, the dielectric material 110 may be formed by a laminating process, for example. The dielectric material 110 may be formed on the bottom portion 101 of the cavity 102, on the angled portion 103 of the cavity 102, and on a portion of the top portion 105 of the cavity 102 of the plating material 100 that surrounds the die 104. Vias 112 may be formed in a region 114 of the dielectric material 110 adjacent the die 104 (FIG. 1e). In an embodiment, a package on package (PoP) land area 113 may be formed within the via 112, wherein a portion of the plating material 100 may be removed to form the PoP land area 113. In an embodiment, the plating material 100 and the dielectric material 110 may be removed using any suitable etching process.

Figure 1F:
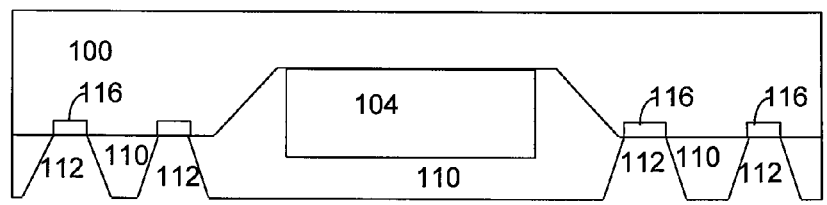

In an embodiment, a PoP land structure 116 may be formed in the PoP land area 113 (FIG. 1f). The PoP land structure 116 may be formed in the PoP land area 113 by using an electrolytic plating process, for example, however any suitable process may be utilized to form the PoP land structure 116. In an embodiment, the plating material 100 within the PoP land area 113 may be used as a plating bus for the formation of the PoP land structure 116. In an embodiment, the plating material 100 may comprise a copper foil that may be used as a plating bus. In some cases, plating metallurgies may include gold, nickel, gold/nickel, gold/nickel/palladium, and the similar suitable materials, according to the particular application. In an embodiment, wire bond pads may be plated on the PoP land area 113, allowing for a mixed-technology stacking on a CPU die backside, for example.

Figure 1G:
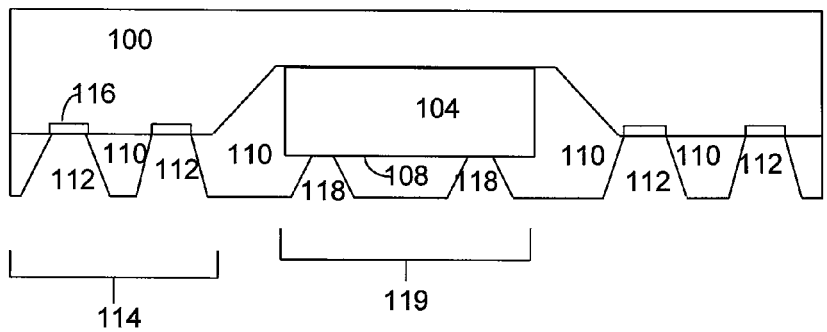
Figure 1H:
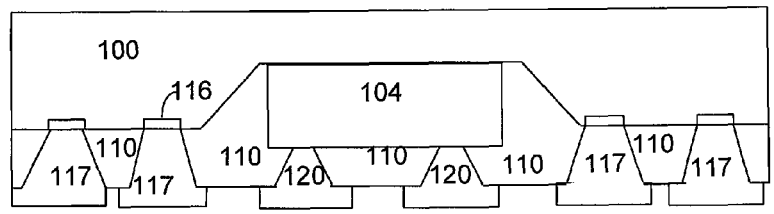

In an embodiment, vias 118 may be formed in a die area 119, wherein die pads, for example copper die pads, maybe exposed on the active side 108 of the die 104 (FIG. 1g). The vias 112 adjacent the PoP land structures 116 (those located in the dielectric region 114) and the vias 118 in the die area 119 may be plated with a metallic material (FIG. 1h) to form PoP land structure 116 interconnect structures 117 and to form die pad interconnect structures 120. In an embodiment, the PoP land interconnect structure 117 may be electrically connected to the PoP land structure 116, and the die pad interconnect structure 120 may be electrically connected to die pads on the active side 108 of the die 104.

Figure 1I:
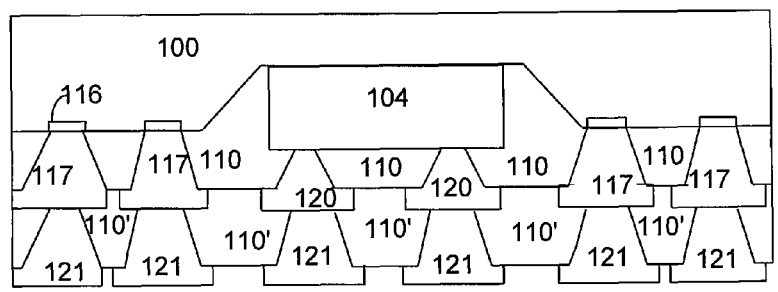

In an embodiment, a semi-additive process (SAP) may be used to form the die pad interconnect structures 120 and the PoP interconnect structures 118. In some embodiments, the die pad interconnect structures 120 and the PoP interconnect structures 118 may be formed in the same process step, or in other embodiments, the die pad interconnect structures 120 and the PoP interconnect structures 118 may be formed in separate formation steps. A second dielectric layer 110' may be formed on the die pad interconnect structures 120 and the PoP interconnect structures 118 (FIG. 1i). A first metallization layer 121 may be formed in the second dielectric layer 110'.

Figure 1J:
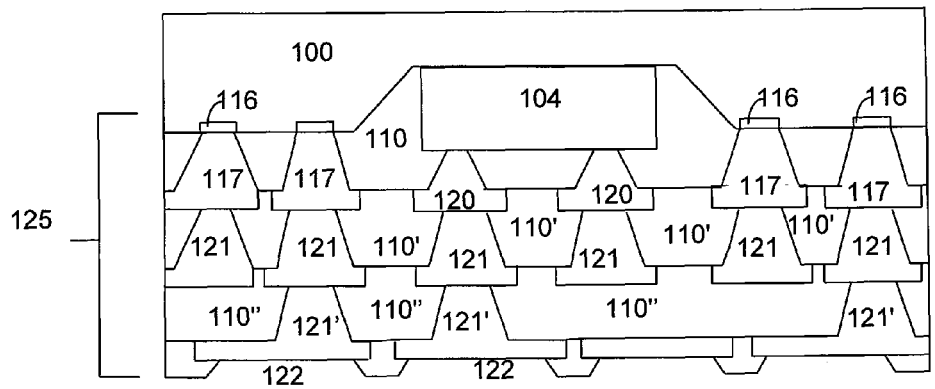
Figure 1K:
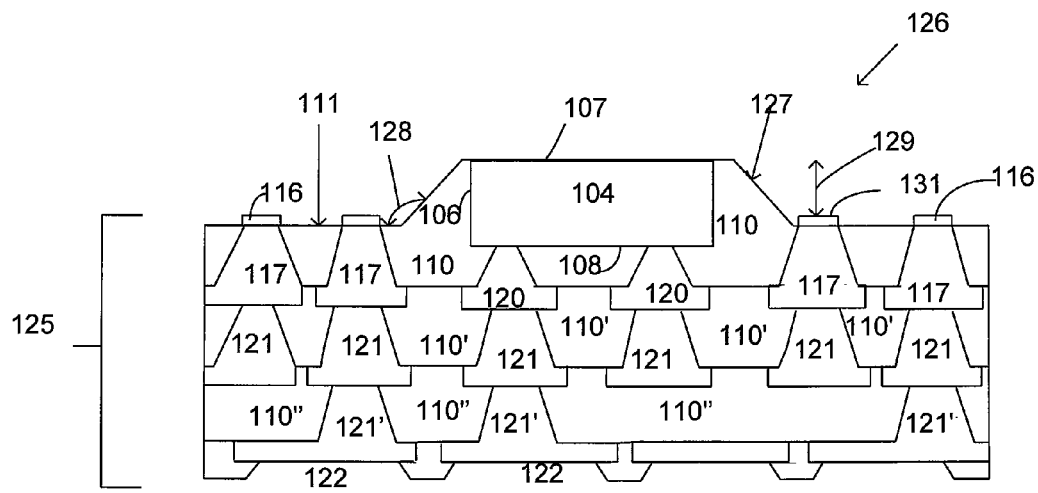

Subsequent layers may then be formed using standard substrate SAP build-up processing, for example, wherein further dielectric layers 120" and metallization layers 121' may be formed upon each other to form a coreless substrate 125 by utilizing a buildup process (FIG. 1j). The plating material 100 may then be removed from the die 104 and the PoP land structures 116 of the coreless substrate 125, exposing the PoP lands and the die, to form a coreless package structure 126 (FIG. 1k). The coreless package structure 126 may comprise a fillet structure 127 of dielectric material 110 around the die 104, wherein the dielectric material 110 may surround the sidewall 106 and the bottom 108 of the die 104, but wherein the dielectric material 110 is absent on the top side 107 of the die 104.

The fillet structure 127 may comprise a portion of the dielectric 110 that may be angled/raised in relation to a planar top portion 111 of the dielectric 110 of the coreless substrate 125. The geometry of this fillet structure 127 can be optimized to provide maximum reliability of the die/package, wherein an angle 128 of the fillet structure 127 may be varied to optimize reliability. In an embodiment, the angle of the fillet structure may comprise about 70 degrees or less, but may be varied according to the application.

In an embodiment, the coreless package structure 126 may comprise the die 104 being at least partially embedded in the coreless substrate 125. In other embodiments, the coreless package structure 126 may comprise the die 104 being substantially entirely embedded in the coreless substrate 125. In some embodiments, the top side 107 of the die 104 may be substantially coplanar with the top portion 111 of the dielectric 110. In another embodiment, there may be a distance 129 between the top side 107 of the die 104 and a top side 131 of the PoP land 116.

Figure 1L:
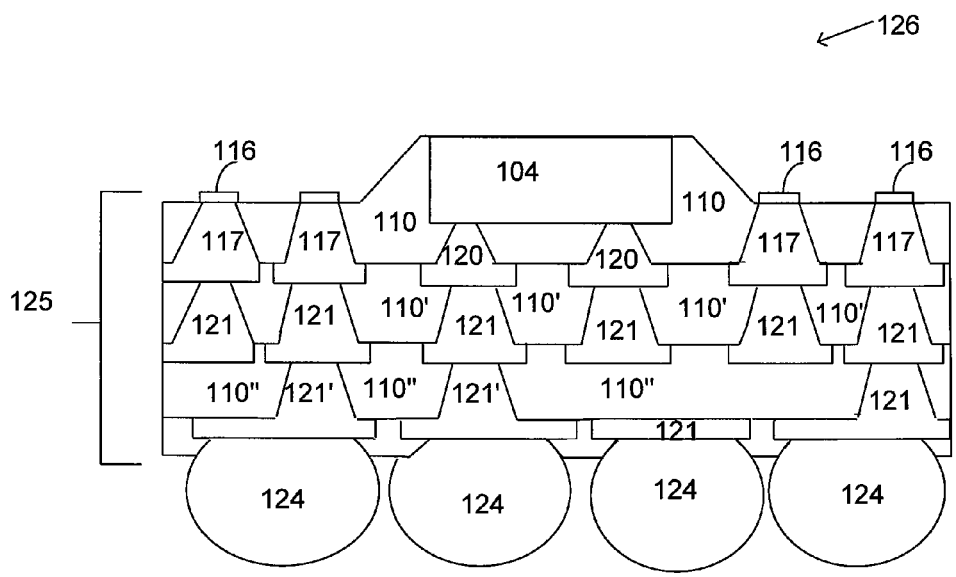

The coreless package structure 126 may comprise package interconnect structures areas 122, wherein interconnect structures 124, such as ball gird array (BGA) balls, may be attached (FIG. 1l). The PoP land structures 116 of the coreless package structure 126 may comprise raised, electrolytically plated lands 116 disposed on top of the coreless substrate 125, thus enabling the attachment of another package on top of the coreless package structure 126 (e.g. Package-on-Package structure).

Figure 1M:
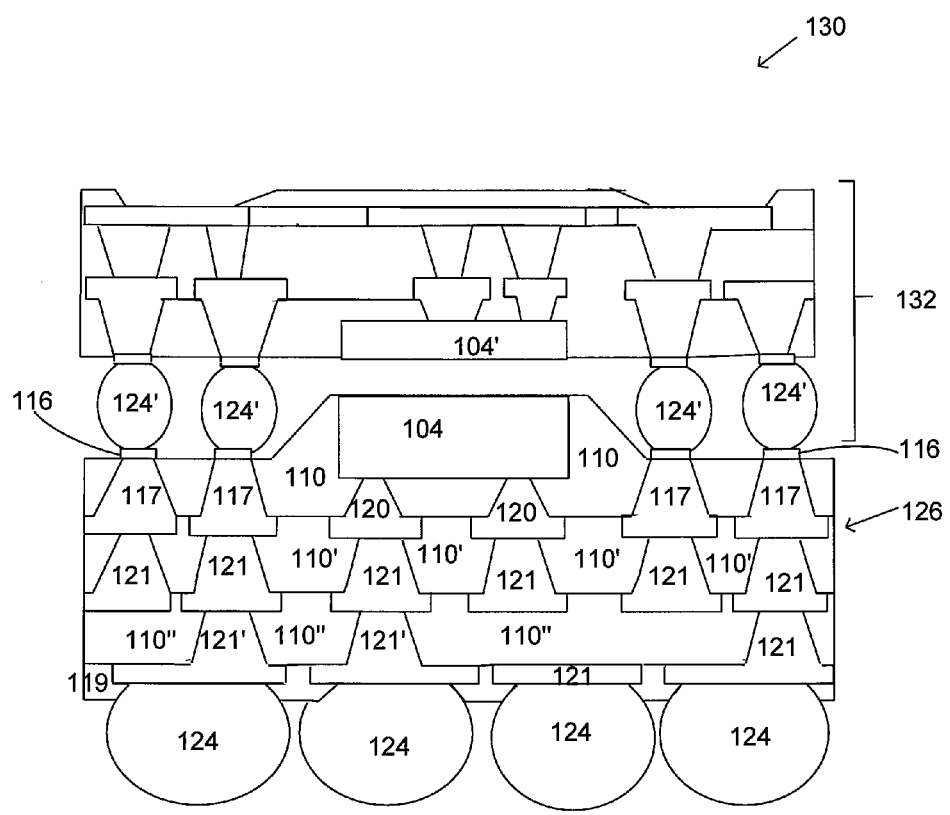

FIG. 1m depicts a PoP structure 130, wherein a second package 132 is connected to the coreless package structure 126 by attachment to the PoP land structures 116. In an embodiment, the second package 132 may comprise a die 104' that is directly above the die 104 of the coreless package structure 126. Interconnect balls 124' of the second package 132 may be attached to the PoP land structures 116 of the coreless package structure 126.

Figure 2:
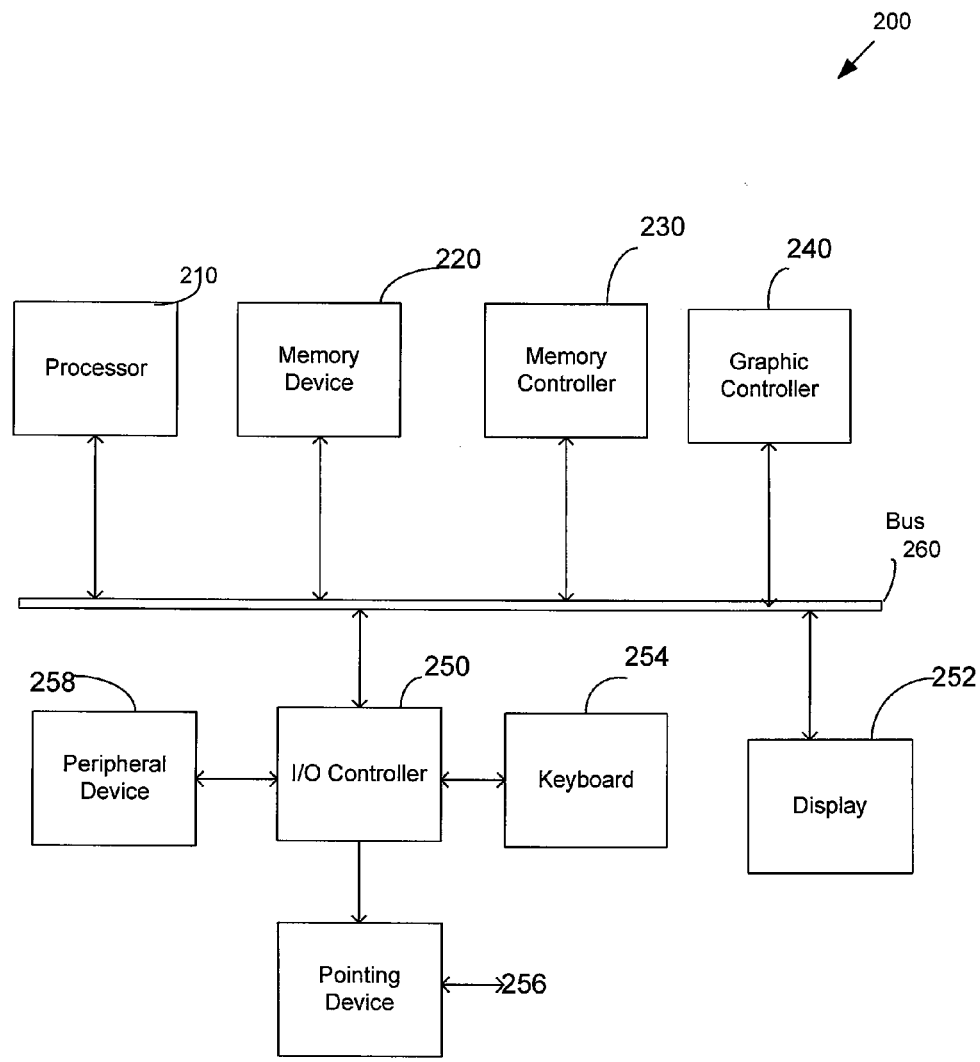
FIG. 2 represents a system according to an embodiment of the invention.

FIG. 2 is a diagram illustrating an exemplary system 200 capable of being operated with methods for fabricating a microelectronic structure, such as the coreless package structure 126 of FIG. 1l, for example. It will be understood that the present embodiment is but one of many possible systems in which the coreless package structures of the present invention may be used.

FIG. 2 shows a computer system according to an embodiment of the invention. System 200 includes a processor 210, a memory device 220, a memory controller 230, a graphics controller 240, an input and output (I/O) controller 250, a display 252, a keyboard 254, a pointing device 256, a peripheral device 258, and a bus 260. Processor 210 may be a general purpose processor or an application specific integrated circuit (ASIC). I/O controller 250 may include a communication module for wired or wireless communication. Memory device 220 may be a dynamic random access memory (DRAM) device, a static random access memory (SRAM) device, a flash memory device, or a combination of these memory devices. Thus, in some embodiments, memory device 220 in system 200 does not have to include a DRAM device.

One or more of the components shown in system 200 may be included in one or more integrated circuit packages, such as the coreless package structure 126 of FIG. 1l for example. For example, processor 210, or memory device 220, or at least a portion of I/O controller 250, or a combination of these components may be included in an integrated circuit package that includes at least one embodiment of a structure described in FIGS. 1a-1m.

System 200 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the present invention enable a new packaging architecture that can meet design requirements for future mobile/handheld system on a chip (SoC) processors at roughly half the cost of current package architectures. Embodiments provide a method of embedding a die in a substrate, which enables the elimination of many assembly processes. Embodiments enable thin die assembly, PoP compatibility, substrate design rule scalability, package thickness reduction, and package/assembly cost reduction. In addition, the substrate is no longer confined to strip manufacturing capability, which enables full panel processing, which also reduces costs.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising:
   forming a cavity in a plating material;
   attaching a die in the cavity;
   forming a dielectric material adjacent the die and over the plating material;
   forming vias through the dielectric material in a region of the dielectric material adjacent the die;
   forming package-on-package land areas in the plating material by removing a portion of the plating material within the vias;
   forming package-on-package land structures in the package-on-package land areas;
   forming vias through the dielectric material in the die area to expose die pads on the die;
   forming die pad interconnect structures in the die area vias and forming package-on-package interconnect structures in the dielectric region vias; and
   removing the plating material to expose the die and the package-on-package land structures.

2. The method of claim 1 further comprising forming subsequent metal layers on the die pad interconnect structures and on the package-on-package interconnect structures to form a coreless substrate.

3. The method of claim 2 further comprising wherein the die is partially embedded into the coreless substrate, and wherein the dielectric material is formed along a portion of a sidewall of the die.

4. The method of claim 2 further comprising wherein the die is substantially fully embedded into the coreless substrate, and wherein the dielectric material is formed along a portion of a sidewall of the die.

5. The method of claim 2 further comprising wherein the package-on-package land structures comprise raised, electrolytically plated lands on top of the coreless package.

6. The method of claim 1 further comprising wherein a portion of the dielectric material comprises a fillet structure surrounding a portion of the sidewall of the die.

7. The method of claim 6 further comprising wherein an angle is between a raised portion of the fillet structure and a planar top portion of the dielectric material.

8. The method of claim 1 further comprising wherein interconnect structures of a second package are attached to the package-on-package land structures.

9. A method comprising:
   forming a cavity in a plating material to hold a die;
   attaching the die in the cavity;
   forming a dielectric material adjacent the die and over the plating material;
   forming vias through the dielectric material in the dielectric material adjacent the die;
   forming package-on-package land areas in the plating material by removing a portion of the plating in the vias;
   forming package-on-package lands in the package-on-package land areas;
   forming interconnects in the vias; and
   removing the plating material to expose the package-on-package lands and die, wherein the die is disposed above the package-on-package lands.

10. The method of claim 9 further comprising wherein the die is attached using an adhesive film.

11. The method of claim 9 further comprising wherein the plating material comprises an electroplating metal.

12. The method of claim 11 wherein forming the package-on-package lands in the vias further comprises forming wire bond pads in the vias.

13. The method of claim 9 further comprising wherein forming the package-on-package lands in the vias comprises using the plating material as the plating bus to form the package-on-package lands.

14. The method of claim 9 further comprising:
    forming vias in a die area, exposing pads on the die; and
    plating the vias in the die area.

15. The method of claim 14 further comprising wherein a coreless substrate is built up on the package-on-package lands and on the plated die vias.

* * * * *